United States Patent [19]
Kannegundla et al.

[11] Patent Number: 5,319,263
[45] Date of Patent: Jun. 7, 1994

[54] POWER SAVING IMPEDANCE TRANSFORMATION CIRCUIT FOR CCD IMAGE SENSORS

[75] Inventors: Ram Kannegundla, Rochester; Teh-Hsuang Lee, Webster, both of N.Y.

[73] Assignee: Eastman Kodak Company, Rochester, N.Y.

[21] Appl. No.: 890,402

[22] Filed: May 29, 1992

[51] Int. Cl.$^5$ .................. H03K 19/018; G11C 27/02
[52] U.S. Cl. ................................ 307/491; 307/353; 307/362; 307/475
[58] Field of Search ............... 307/350, 362, 475, 353, 307/491, 494

[56] References Cited
U.S. PATENT DOCUMENTS

| | | | |
|---|---|---|---|
| 3,972,004 | 7/1976 | Libs | 307/362 |
| 4,287,441 | 9/1981 | Smith | 307/353 |
| 4,556,851 | 12/1985 | Levine | 329/50 |
| 5,032,740 | 7/1991 | Kannegundla | 307/264 |

*Primary Examiner*—John Zazworsky
*Attorney, Agent, or Firm*—Raymond L. Owens

[57] ABSTRACT

A power saving impedance transformation circuit for receiving a d-c biased signal comprises a junction transistor connected to operate as an emitter follower, means for connecting the base of the transistor to receive the signal, an operational amplifier having both inverting and non-inverting inputs, a first resistor connected between the emitter of the transistor and the operational amplifier inverting input, a second resistor equal to the first resistor in resistance and having one end connected to the operational amplifier inverting input, resistive means for connecting the other end of the second resistor to a first voltage source of a polarity which, in cooperation with the signal, forward biases the emitter-base junction of the transistor, the emitter-base junction of the transistor receiving its forward bias from the first voltage source exclusively through the first and second resistors and the resistive means, and means for connecting the collector of the transistor to a second voltage source of a polarity opposite to that of the first voltage source.

18 Claims, 1 Drawing Sheet

POWER SAVING IMPEDANCE TRANSFORMATION CIRCUIT FOR CCD IMAGE SENSORS

FIELD OF THE INVENTION

This invention relates generally to impedance transformation circuits and, more particularly, to impedance transformation circuits used to drive a frame store controlling a video monitor from a multiple output CCD (charge coupled device) image sensor.

BACKGROUND OF THE INVENTION

A CCD sensor used for electronic imaging applications typically includes both horizontal and vertical shift registers (internal to the sensor structure) to supply charge levels indicative of individual pixels in a scanned image to external equipment such as a frame store controlling a video monitor. At the end of the horizontal shift register, an output amplifier is provided to drive all necessary output signal processing circuits. The output from the sensor's horizontal shift register, and hence from its output amplifier, takes the form of a square wave having a frequency equal to the horizontal clock frequency of the sensor. A correlated double sample and hold (CDS/H) circuit is normally also connected to receive the square wave sensor output, detect the difference between the pre-charge level of that output and the signal levels representing individual pixel images, and serve as a low pass filter. Often, the CDS/H circuit lacks sufficient driving capacity. For that reason, a transistor emitter follower (which has a high input impedance and a low output impedance) is commonly connected to receive the CDS/H circuit output and provide a necessary impedance transformation function and, thereby, the needed driving capacity.

In one important example, the output of the CDS/H circuit has one or two volts of d-c bias. A transistor emitter follower driven from the CDS/H circuit is then operated with dual power supplied (one connected to the collector of the transistor and another, of opposite polarity, connected to the emitter of the transistor through a load resistor) in order to avoid clipping. With the emitter follower impedance transformation circuits found in the prior art, such an arrangement introduces problems of power dissipation. Recently developed CCD image sensors, moreover, have multiple outputs and, for that reason, need as many CDS/H circuits and emitter followers as they have outputs. In such multiple emitter follower arrangements, power dissipation problems are correspondingly larger and, because of heat build up around the sensor and a resulting increase in sensor temperature, tend to cause so-called dark current problems in the CCD sensor. A better way of powering the transistor emitter followers receiving the outputs of multiple output CCD image sensors is, therefore, highly desirable.

SUMMARY OF THE INVENTION

The present invention significantly reduces the power dissipation previously engendered through the use of transistor emitter followers at CCD image sensor outputs and does so, moreover, through the use of a reduced number of circuit elements. In particular, the usual emitter follower load resistor is eliminated entirely and the necessary forward emitter-base bias for the emitter follower transistor is provided through an alternative circuit path which is already needed for other purposes.

In its broader aspects, the invention takes the form of a power saving impedance transformation (driver) circuit for receiving a d-c biased output from a CDS/H circuit. In particular, such an impedance transformation circuit comprises a junction transistor emitter follower, means for connecting the base of the transistor to receive the d-c biased CDS/H circuit output, an operational amplifier having both an inverting input and a non-inverting input, a first resistor connected between the emitter of the transistor and the inverting input of the operational amplifier, a second resistor having a resistance substantially equal to that of the first resistor and having one end connected to the inverting input of the operational amplifier, resistive means for connecting the other end of the second resistor to a first voltage source of a polarity which, in cooperation with the CDS/H circuit output, forward biases the emitter-base junction of the transistor, the emitter-base junction of the transistor receiving its forward bias from the first voltage source exclusively through the first and second resistors and the resistive means, and means for connecting the collector of the transistor to a second voltage source of a polarity composite to that of the first voltage source.

In embodiments of the invention, the second resistor and the first voltage source not only subtract the d-c bias of the CDS/H circuit output from the emitter follower output but also provide the emitter-base junction of the emitter follower transistor with the forward bias needed for operating the transistor in a linear mode. Because the emitter-base junction of the emitter follower transistor receives its forward bias exclusively through the named resistors and resistance means, the voltage drop across the collector-emitter path of the transistor is less than that encountered in the prior art and power dissipation is cut to a mere fraction of that found in the prior art.

In accordance with a further aspect of the invention, the power saving impedance transformation circuit of the invention further comprises a third resistor having one end connected to the non-inverting input of the operational amplifier and means for connecting the other end of the third resistor to a point of reference potential (e.g., ground) intermediate the first and second voltage sources.

In accordance with a still further aspect of the invention, the power saving impedance transformation circuit of the invention further comprises a feedback resistor connected between the output of the operational amplifier and the inverting input of the operational amplifier.

In accordance with yet another aspect of the invention, the power saving impedance transformation circuit of the invention further comprises a filter capacitor having one side connected to the other end of the second resistor and means for connecting the other side of the capacitor to the point of reference potential.

From another point of view, the invention takes the form of a combination which includes a CCD image sensor with at least one output and a CDS/H circuit connected to receive the output, the CDS/H circuit producing a d-c biased sampled and held output, and the power saving impedance transformation circuit described above for receiving the CDS/H circuit output signal. The reduced power dissipation of the transfer circuit is additionally significant in that, by reducing sensor heating, it helps avoid dark current problems in the CCD sensor.

From yet another point of view, the invention takes the form of a combination which includes a CCD image sensor with multiple outputs and respective CDS/H circuits connected to receive each of the outputs, each of the CDS/H circuits producing a respective d-c biased sampled and held output, and a plurality of the power saving impedance transformation circuits described above for receiving respective ones of the sensor square wave signals. The reduced power dissipation of the impedance transformation circuit is particularly significant in that, by reducing sensor heating, it helps avoid dark current problems in the CCD sensor.

Viewed from another aspect, the present invention is directed to circuitry. The circuitry comprises a bipolar transistor having a base, an emitter and a collector; first and second essentially equal resistors each having first and second terminals; resistive means having first and second terminals; a operational amplifier having an inverting input, a non inverting input, and an output; a circuitry input terminal coupled to the base of the transistor; a circuitry output terminal coupled to the output of the operational amplifier; a first power supply terminal is coupled to the collector of the transistor; a second power supply terminal is coupled to the second terminal of the resistive means; and a third power supply terminal is coupled to the non-inverting input of the operational amplifier. The first terminal of the first resistor is coupled to the emitter of the transistor. The second terminal of the first resistor is coupled to the first terminal of the second resistor and to the inverting input of the operational amplifier. The second terminal of the second resistor is coupled to the first terminal of the resistive means.

The invention may be more fully understood from the following detailed description, taken in the light of the accompanying drawing and the appended claims.

DETAILED DESCRIPTION

Figure 1:
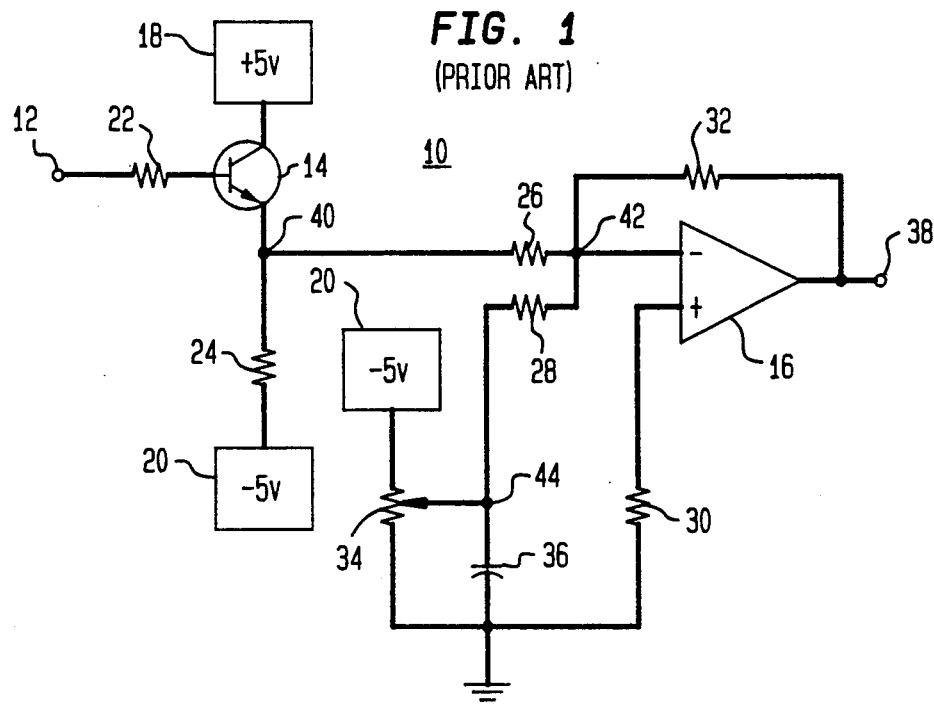
FIG. 1 is a schematic diagram illustrating an impedance transformation (driver) circuit of the type commonly encountered in the prior art.

FIG. 1 illustrates an impedance transformation (driver) circuit 10 of the type commonly used in the prior art to drive a frame store (not shown) from the output circuitry of a CCD video sensor (not shown). The principal components of transfer circuit 10 include an input terminal 12, an n-p-n junction transistor 14, an operational amplifier 16, a positive 5 volt d-c source 18, a negative 5 volt d-c source 20, resistors 22, 24, 26, 28, 30, and 32, a resistive potentiometer 34, a filter capacitor 36, and an output terminal 38. Input terminal 12 receives a d-c biased output from a CDS/H circuit (not shown).

Transistor 14, which is connected to function as an emitter follower, has its collector connected directly to positive source 18 and its emitter connected to a node 40. Node 40, in turn, is connected through resistor 24 to negative source 20. Resistor 24 thus serves as a conventional load resistor for the emitter follower.

Operational amplifier 16 is of a type well known in the art and has an inverting input (marked "−" in accordance with convention), a non-inverting input (marked "+" in accordance with convention), and a single output connected to an output terminal 38. The inverting input of operational amplifier 16 is connected to a node 42 (a virtual ground in the sense that it maintains the same potential as the non-inverting input of operational amplifier 16). Resistor 26 is connected between nodes 40 and 42. Resistor 28 is connected between node 42 and a node 44. Node 44, in turn, is connected to the slider of a potentiometer 34, the resistance arm of which is connected between negative source 20 and ground (reference potential). Capacitor 36 has one side connected to node 44 and the other connected to ground. Resistor 30 is connected between the non-inverting input of operational amplifier 16 and ground to establish the appropriate d-c level for the inverting input of operational amplifier 16. Resistor 32 is a feedback resistor and is connected from output terminal 38 back to node 42 and, thus, to the inverting input of operational amplifier 16. Finally, resistor 22 is connected in a series path from input terminal 12 to the base of transistor 14 to prevent possible oscillations.

In at least one example, the CDS/H circuit output signal supplied to input terminal 12 has one or two volts of positive d-c bias. That signal may, for example, have a normal d-c voltage of 1.0 to 1.5 volts for zero video signal and 0.5 to 1.0 volts for full video. For this reason, emitter resistor 24 is returned to an available negative 5 volt source 20 in order to avoid clipping the lower end of the signal. Quiescent power dissipation in the emitter follower is in one illustrative example about 58 milliwatts and power dissipation in resistors 26 and 28 and potentiometer 34 is about 12 milliwatts. Potentiometer 34 subtracts the positive voltage from the emitter follower, so that the output of operational amplifier 16 is a d-c free video signal.

The following resistance values for a number of the resistors in prior art impedance transformation circuit 10 are illustrative:

| | |
|---|---|
| Resistor 24 | 1000 ohms |
| Resistor 26 | 1000 to 2000 ohms |
| Resistor 28 | 1000 to 2000 ohms |
| Resistor 32 | 1000 to 5000 ohms |
| Resistance Arm of Potentiometer 34 | 2000 ohms |

Figure 2:
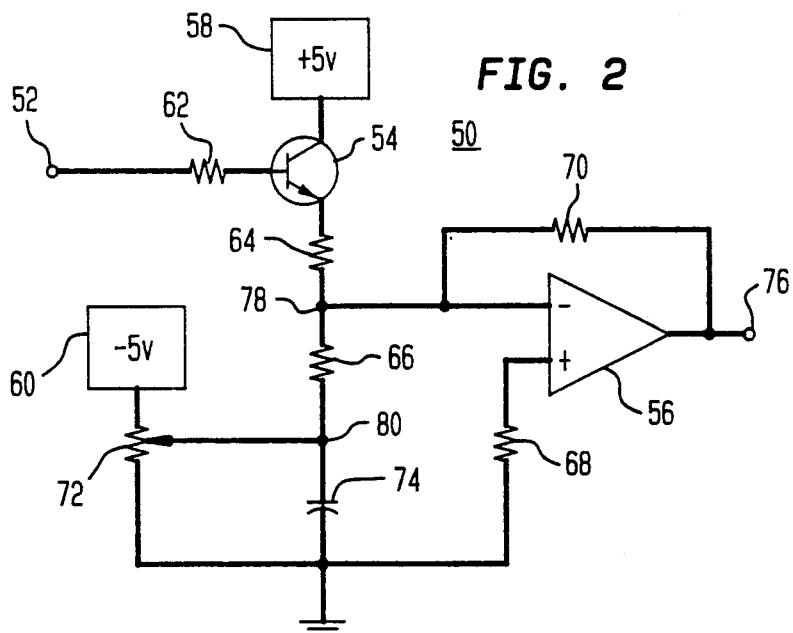
FIG. 2 is a schematic diagram illustrating a power saving impedance transformation (driver) circuit in accordance with the present invention.

FIG. 2 illustrates a power saving impedance transformation (driver) circuit 50 in accordance the present invention. Although voltage sources and ground are shown as part of circuit 50 for clarity of explanation, it should be understood that they need not be included as part of specific embodiments of the invention as manufactured or sold. Typically, such voltage sources and grounds are provided when such embodiments are connected into their ultimate environments and activated for actual use. Circuit 50 comprises an input terminal 52, an n-p-n junction transistor 54, an operational amplifier 56, a positive 5 volt d-c source 58, a negative 5 volt d-c source 60, resistors 62, 64, 66, 68, and 70, a resistive potentiometer 72, a filter capacitor 74, and an output terminal 76. Input terminal 52 receives a d c biased output signal from a CDS/H circuit (not shown).

Operational amplifier 56 is of a type well known in the art and has an inverting input (marked "−" in accordance with convention), a non-inverting input (marked "+" in accordance with convention), and a single output terminal 76 which serves as the output terminal of impedance transformation circuit 50. The inverting input of operational amplifier 56 is connected to a node 78 (a virtual ground in the sense that it maintains the same potential as the non inverting input of operational amplifier 56). Resistor 64 is connected between the emitter of transistor 54 and node 78 and serves as an emitter load resistor. Resistor 66 is connected between node 78 and a node 80. Node 80, in turn, is connected to the variable contact (slider) of a potentiometer 72. The resistance arm of potentiometer 72 is connected between negative source 60 and ground (reference potential).

Capacitor 74 has one side connected to node 80 and the other connected to ground. Resistor 68 is connected between the positive input of operational amplifier 56 and ground to establish the appropriate d-c level for the inverting input of operational amplifier 56. Resistor 70 is a feedback resistor and is connected from output terminal 76 back to node 78 and, thus, to the inverting input of operational amplifier 56. Finally, resistor 62 is connected in a series path from input terminal 52 to the base of transistor 54 in order to prevent possible oscillations.

The d-c biased sampled and held signal supplied to input terminal 52 is the same as that supplied to input terminal 12 in prior art impedance transformation circuit 10 in FIG. 1. Quiescent power dissipation through emitter follower transistor 54, resistors 64 and 66, and potentiometer 72 is about 40 milliwatts compared to 70 milliwatts for the power dissipation of emitter follower transistor 14, resistors 24, 26, 28 and potentiometer 34 of circuit 10 of FIG. 1. The resistance arm of potentiometer 72 has less resistance than that of potentiometer 34 in prior art impedance transformation circuit 10 in order to provide better slider resolution for potentiometer 72. The lower resistance of potentiometer 72 increases power dissipation slightly, but the overall reduction in power dissipation in impedance transformation circuit 50 remains vastly reduced in comparison with that found in prior art impedance transformation circuit 10 in FIG. 1.

The following resistance values for a number of the resistors in impedance transformation circuit 50 are illustrative:

| | |
|---|---|
| Resistor 64 | 250 ohms |
| Resistor 66 | 250 ohms |
| Resistor 70 | 1500 ohms |
| Resistance Arm of Potentiometer 72 | 1000 ohms |

Figure 3:
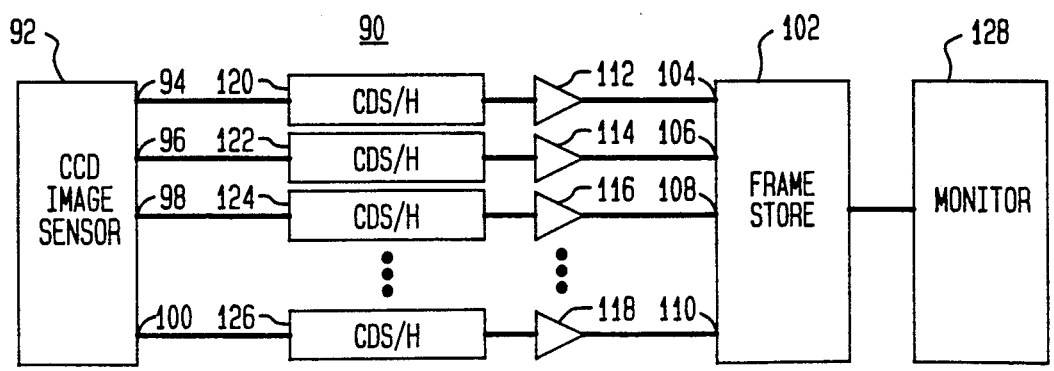
FIG. 3 is a block diagram illustrating a plurality of power saving impedance transformation circuits in accordance with the invention, shown in the context of a multiple output CCD image sensor.

FIG. 3 illustrates a complete system 90 in accordance with the invention, using power saving impedance transformation circuit 50 to particular advantage. System 90 includes a CCD video sensor 92 having multiple outputs, of which sensor outputs 94, 96, 98, and 100 are shown. System 90 also includes a frame store 102 having the same number of inputs as sensor 92 has outputs. Of these inputs of frame store 102, inputs 104, 106, 108, and 110 are shown. Also included are multiple impedance transformation circuits, of which transfer circuits 112, 114, 116, and 118 are shown, and multiple CDS/H circuits, of which CDS/H circuits 120, 122, 124, and 126 are shown. Transfer circuits 112, 114, 116, and 118 are all substantially identical to transfer circuit 50. Also included is a video monitor 128.

As illustrated, CDS/H circuit 120 and impedance transformation circuit 112 are connected in sequence between sensor output 94 and frame store input 104, CDS/H circuit 122 and impedance transformation circuit 114 are connected in sequence between sensor output 96 and frame store input 106, CDS/H circuit 124 and impedance transformation circuit 116 are connected in sequence between sensor output 98 and frame store input 108, and CDS/H circuit 126 and impedance transformation circuit 118 are connected in sequence between sensor output 100 and frame store input 110. The single output of frame store 102 is connected to video monitor 128 by way of a suitable digital to analog converter (not shown). For a CCD sensor 92 with 64 outputs, the incremental power dissipation saving of the present invention per channel results in a total power dissipation saving multiplied 64 times for the entire system.

It is to be understood that the embodiment of the invention which has been described is illustrative. Numerous other arrangements and modifications may be readily devised by those skilled in the art without departing from the spirit and scope of the invention. A transistor of opposite conductivity type to that shown may be used providing that the bias and polarity of the CDS/H circuit output supplied to input terminal 52 are reversed and the polarity of each voltage source is reversed.

What is claimed is:

1. A power saving impedance transformation circuit for receiving a d-c biased signal comprising:

a transistor having an emitter, a collector, and a base, an emitter-base junction between said emitter and said base, and a collector-base junction between said collector and said base;

means for connecting the base of said transistor to receive said signal;

an operational amplifier having both inverting and non-inverting inputs and an output, said operational amplifier output comprising the output of said impedance transformation circuit;

a first resistor connected between the emitter of said transistor and said operational amplifier inverting input;

a second resistor substantially equal to said first resistor in resistance and having one end connected to said operational amplifier inverting input;

a third resistor connecting the non-inverting input to ground;

variable resistive means for connecting the other end of said second resistor to a first voltage source of a desired polarity to provide a variable voltage, the variable voltage being selected in cooperation with said signal, to forward biases the emitter-base junction of said transistor to achieve low power dissipation;

the emitter-base junction of said transistor receiving its forward bias from said first voltage source exclusively through said first and second resistors and said resistive means; and means for connecting the collector of said transistor to a second voltage source of a polarity opposite to that of said first voltage source.

2. The power saving impedance transformation circuit of claim 1 in which said transistor is an n-p-n transistor, said first voltage source is a negative voltage source and said second voltage source is a positive voltage source.

3. The power saving impedance transformation circuit of claim 1 further comprising:
a third resistor having one end connected to said operational amplifier non-inverting input; and
means for connecting the other end of said third resistor to a point of reference potential intermediate said first and second voltage sources.

4. The power saving impedance transformation circuit of claim 3 further comprising a feedback resistor connected between said operational amplifier output and said operational amplifier inverting input.

5. The power saving impedance transformation circuit of claim 4 further comprising:
a capacitor having one side connected to said other end of said second resistor; and
means for connecting the other side of said capacitor to said point of reference potential.

6. The power saving impedance transformation circuit of claim 5 in which said transistor is an n-p-n transistor, said first voltage source is a negative voltage source, said second voltage source is a positive voltage source, and said intermediate potential is ground.

7. In combination with a CCD image sensor having at least one output and a correlated double sample and hold circuit connected to receive said output, said sample and hold circuit producing a d-c biased signal, a power saving impedance transformation circuit for receiving said signal comprising:
a transistor having an emitter, a collector, and a base, an emitter-base junction between said emitter and said base, and a collector-base junction between said collector and said base;
means for connecting the base of said transistor to receive said signal:
an operational amplifier having both inverting and non-inverting inputs and an output, said operational amplifier output providing the output of said impedance transformation circuit;
a first resistor connected between the emitter of said transistor and said operational amplifier inverting input;
a second resistor substantially equal to said first resistor in resistance and having one end connected to said operational amplifier inverting input;
resistive means for connecting the other end of said second resistor to a first voltage source of a polarity which, in cooperation with said signal, forward biases the emitter-base junction of said transistor;
the emitter-base junction of said transistor receiving its forward bias from said first voltage source exclusively through said first and second resistors and said resistive means; and
means for connecting the collector of said transistor to a second voltage source of a polarity opposite to that of said first voltage source.

8. The combination of claim 7 in which said transistor is an n-p-n transistor, said first voltage source is a negative voltage source and said second voltage source is a positive voltage source.

9. The combination of claim 7 in which said power saving impedance transformation circuit further comprises:
a third resistor having one end connected to said operational amplifier non inverting input; and
means for connecting the other end of said third resistor to a point of reference potential intermediate said first and second voltage sources.

10. The combination of claim 9 in which said power saving impedance transformation circuit further comprises a feedback resistor connected between said operational amplifier output and said operational amplifier inverting input.

11. The combination of claim 10 in which said power saving impedance transformation circuit further comprises:
a capacitor having one side connected to said other end of said second resistor; and
means for connecting the other side of said capacitor to said point of reference potential.

12. The combination of claim 11 in which said transistor is an n-p-n transistor, said first voltage source is a negative voltage source, said second voltage source is a positive voltage source, and said intermediate potential is ground.

13. In combination with a CCD image sensor having a plurality of outputs and a plurality of correlated double sample and hold circuits each connected to receive a respective one of aid outputs, each of sample and hold circuits producing a respective d-c biased single, a plurality of low power dissipation circuits for receiving respective ones of said signals, a plurality of power saving impedance transformation circuits for receiving respective ones of said signals each comprising:
a transistor having an emitter, a collector, and a base, an emitter-base junction between said emitter and said base, and a collector-base junction between said collector and said base;
means for connecting the base of said transistor to receive a respective one of said signals;
an operational amplifier having both inverting and non-inverting inputs and an output, said operational amplifier output comprising the output of said impedance transformation circuit;
a first resistor connected between the emitter of said transistor and said operational amplifier inverting input;
a second resistor substantially equal to said first resistor in resistance and having gone end connected to said operational amplifier inverting input;
a third resistor connecting the non-inverting input to ground;
variable resistive means for connecting the other end of said second resistor to a first voltage source of a desired polarity to provide a variable voltage, the variable voltage being selected in cooperation with a respective one of said signals, to forward biases the emitter-base junction of said transistor to achieve low power dissipation;
the emitter-base junction of said transistor receiving its forward bias from said first voltage source exclusively through said first and second resistors and sad resistive means; and
means for connecting the collector of said transistor to a second voltage source of a polarity opposite to that of said first voltage source.

14. The combination of claim 13 in which said transistor is an n-p-n transistor, said first voltage source is a negative voltage source and said second voltage source is a positive voltage source.

15. The combination of claim 13 in which each of said power saving impedance transformation circuits further comprises:
   a third resistor having one end connected to said operational amplifier non-inverting input; and
   means for connecting the other end of said third resistor to a point of reference potential intermediate said first and second voltage sources.

16. The combination of claim 15 in which said power saving impedance transformation circuit further comprises a feedback resistor connected between said operational amplifier output and said operational amplifier inverting input.

17. The combination of claim 16 in which each of said power saving impedance transformation circuits further comprises:
   a capacitor having one side connected to said other end of said second resistor; and
   means for connecting the other side of said capacitor to said point of reference potential.

18. The combination of claim 17 in which said transistor is an n-p-n transistor, said first voltage source is a negative voltage source, said second voltage source is a positive voltage source, and said intermediate potential is ground.

* * * * *